United States Patent van der Mast et al.

[11] Patent Number: 5,221,844
[45] Date of Patent: Jun. 22, 1993

[54] CHARGED PARTICLE BEAM DEVICE

[75] Inventors: Karel D. van der Mast; Alan F. De Jong, both of Eindhoven, Netherlands

[73] Assignee: U.S. Philips Corp., New York, N.Y.

[21] Appl. No.: 837,517

[22] Filed: Feb. 18, 1992

[30] Foreign Application Priority Data

Feb. 20, 1991 [NL] Netherlands ............... 9100294

[51] Int. Cl.⁵ ............................................. H01J 37/26
[52] U.S. Cl. ................................ 250/398; 250/396 R; 250/396 ML; 250/311
[58] Field of Search ........... 250/398, 396 R, 396 ML, 250/311

[56] References Cited

U.S. PATENT DOCUMENTS

| | | | |
|---|---|---|---|
| 3,952,198 | 4/1976 | Harada et al. | 250/396 ML |
| 4,414,474 | 11/1983 | Crewe | 250/396 R |
| 4,554,457 | 11/1985 | Kelly | 250/396 ML |
| 4,673,794 | 6/1987 | Irie et al. | 250/396 ML |
| 4,684,808 | 8/1987 | Plies et al. | 250/396 R |
| 4,962,313 | 10/1990 | Rose | 250/311 |
| 4,963,748 | 10/1990 | Szilagyi | 250/398 |
| 5,084,622 | 1/1992 | Rose | 250/396 R |

FOREIGN PATENT DOCUMENTS 0373399 6/1990 European Pat. Off. .

OTHER PUBLICATIONS

Optik vol. 59. No. 5, 1981 pp. 401-405 "A Simple Stigmator Circuit for Independent Control of Corrector Amplitude and Orientation" Gemperle et al.
Japanese Journal of Applied Pysics vol. 18, No. 7 pp. 1373-1377 "Spherical Aberration Correction of an Electron Lens by Holography" Tonomura et al.

Primary Examiner—Paul M. Dzierzynski
Assistant Examiner—Kiet T. Nguyen
Attorney, Agent, or Firm—William L. Botjer

[57] ABSTRACT

In an electron microscope correction of spherical and chromatic aberration can be achieved in a number of freely adjustable directions by using a multipole correction element whereby a magnetic or electrostatic octupole field, rotatable about the optical axis, or a combined rotatable magnetic and electrostatic quadrupole field is generated. A corrected overall image can be obtained by combination of images successively corrected in different directions. In the case of holographic images, correction in the direction perpendicular to the line direction in the hologram enhances the accuracy of phase determination. A correction element of this kind, having comparatively small dimensions of from 1 to 2 cm, can be simply mounted, notably in a transmission electron microscope, in a space provided for the stigmator.

15 Claims, 4 Drawing Sheets

CHARGED PARTICLE BEAM DEVICE

BACKGROUND OF THE INVENTION

The invention relates to a charged particle beam device, comprising a source for emitting a charged particle beam to an object plane, particle-optical elements which are arranged along an optical axis and which comprise at least one lens for forming an image of the object plane, and a correction element for correction of spherical and/or chromatic aberration in the image of the at least one lens, said correction element comprising a multipole element for generating a magnetic and/or electric potential distribution in a correction plane extending perpendicularly to the optical axis.

A charged particle beam device of this kind is known from U.S. Pat. No. 4,414,474.

The cited Patent Specification describes a correction element for correction of spherical aberration in an electron microscope. Spherical aberration occurs because electrons entering an electron-optical lens from a point on the optical axis are deflected more at the edge of the lens than in parts of the lens which are situated nearer to the optical axis. A point situated on the optical axis is imaged by the lens as a spot having a radius r which is given by $r = MC_s\alpha^3$. Therein, $C_s$ is the spherical aberration coefficient, M is the transverse magnification and $\alpha$ is the angle enclosed by the radius with respect to the optical axis between the point on the optical axis and the edge of the lens. Spherical aberration can be reduced by beam stopping; however, this is not advantageous because information of the object to be imaged is then lost. The spherical aberration coefficient can also be reduced.

A static electric or magnetic field in a charge-free space without charge current densities is described by a potential distribution satisfying Laplace's equations. In a system with cylindrical symmetry this potential distribution can be developed in a series around the optical axis, the series containing only even powers of the distance from the optical axis. The electric or magnetic fields associated with the potential distribution are found by determination of the derivatives of this distribution. When the calculation of a trajectory of a charged particle in these electric or magnetic fields takes into account only the field terms in the series development of the field around the optical axis in which powers of the distance from the optical axis amount to no more than 1, the first-order trajectory is found. When the calculation of the trajectory of the charged particle takes into account field terms with next-higher powers of the distance from the optical axis which are greater than 1, there is found the third-order trajectory which deviates from the first-order trajectory. For charged particles emanating from a point on the optical axis, the deviation in the image plane between the first-order trajectory and the third-order trajectory is called spherical aberration. For magnetic fields the coefficient of spherical aberration can be expressed in an integral along the optical axis between the object plane and the image plane. For systems with cylindrical symmetry, Scherzer has demonstrated that this integral is always negative. Therefore, spherical aberration cannot be corrected by means of cylinder-symmetrical particle-optical elements. Using a correction element comprising two sextupoles grouped around a round lens, according to the known method a third-order effect is exerted on the electron trajectory, which effect opposes the spherical aberration introduced by the cylinder-symmetrical particle-optical system. Such a correction element has the drawback that correction takes place over a comparatively long part of the optical axis and that the correction element has a length of 10 cm in this direction and occupies a comparatively large space. As a result, it is difficult to incorporate the correction element in existing particle-optical apparatus. The requirements imposed as regards the positioning of such a correction element are severe and difficult to satisfy. Moreover, as the dimensions of the correction element are greater, its susceptibility to electromagnetic disturbances also increases because the image information has not yet been magnified at the area of the correction element. It is an object of the invention to provide a charged particle beam device of the kind set forth which comprises a correction element having comparatively small dimensions in the direction of the optical axis.

SUMMARY OF THE INVENTION

To achieve this, a charged particle beam device in accordance with the invention is characterized in that the charged particle beam device comprises means for rotating the potential distribution in the correction plane in order to adjust a correction direction.

Because of the correction of aberrations exclusively in the directions for which it is known in advance that image information of interest is situated therein and which extend in a correction plane perpendicular to the optical axis, it suffices to use a correction element having a comparatively small dimension in the direction of the optical axis (for example, from 1 to 2 cm). Aberrations can be successively corrected for a number of different directions in the correction plane by rotation of the potential distribution, for example by selective excitation of poles of the multipole element or by adaptation of the relative strength of the poles, so that a number of corrected images with enhanced resolution in the correction direction is obtained.

An embodiment of a charged particle beam device in accordance with the invention is characterized in that the charged particle beam device comprises means for combining images which have been successively corrected in different correction directions.

A corrected total image of an object is obtained by combining the corrected images in, for example an image memory of a computer or by superposition of photographic plates.

An embodiment of a charged particle beam device in accordance with the invention is characterized in that the correction plane is coincident with a plane conjugated with a principal plane of the lens.

The spherical and/or chromatic aberrations introduced by the lens are corrected by the correction element. Therefore, the correction element is preferably situated in a plane which is equivalent to the principal plane of the lens. A principal plane of the lens is to be understood to mean herein the plane of action of the lens where lens errors, if any, are introduced.

A further embodiment of a charged particle beam device in accordance with the invention is characterized in that the lens is an objective lens.

In a transmission electron microscope the correction element is preferably disposed behind the objective lens at the area where usually the stigmator is situated. In a scanning electron microscope the correction element is preferably arranged in or near the objective lens, i.e. in front of the specimen. Because of its comparatively large angle of aperture, for example 20 mrad, the objective lens causes a large amount of spherical aberration and chromatic aberration in comparison with other lenses. As a result of its small dimensions, the correction element can be combined with the stigmator, arranged behind the objective lens, in a transmission electron microscope.

An embodiment of a charged particle beam device in accordance with the invention is characterized in that the charged particle beam device comprises an image processing system incorporating an image processing procedure for the selection of the corrected direction in an image.

Via image processing, a desired direction, notably the corrected direction, can thus be selected from an image by selecting this direction in the Fourier space and by suppressing the other directions. Selection takes place on the basis of intensity.

Another embodiment of a charged particle beam device in accordance with the invention, in which the charged particle beam device is constructed as a transmission electron microscope, is characterized in that the charged particle beam device comprises a diaphragm for selecting the corrected direction in the back focal plane of the lens, the diaphragm and the charged particle beam being movable with respect to one another, which movement is coupled to the rotation of the potential distribution of the correction element.

In the back focal plane of the objective lens the electron wave function is represented in the Fourier transformed form. Each direction in the original image is represented by a line. Using a diaphragm, a direction can be selected. There are various possibilities to ensure that the selected direction corresponds to the corrected direction.

A first possibility consists in making the diaphragm rotate together with the rotating multipole field, about the optical axis. The image processing step is then, for example a superposition.

A second possibility consists in that instead of the rotation of the diaphragm, the electron beam incident on the specimen is tilted, the tilting direction being rotated. The electron wave function then rotates relative to a stationary diaphragm in the back focal plane of the objective lens.

An advantage of these filter techniques consists in that the phase information of the wave function is maintained. Such image processing procedures can be advantageously used for image reconstruction.

A further advantage consists in that the non-linear imaging is suppressed considerably, because only the non-linear imaging within the diaphragm is of importance.

A further embodiment of a charged particle beam device in accordance with the invention is characterized in that for correction of spherical aberration the potential distribution comprises an octupole distribution.

The octupole exerts a force directed towards the optical axis on a charged particle in two mutually perpendicular directions, which force is proportional to the third power of the distance of the charged particle from the optical axis. In two other mutually perpendicular directions, the force exerted on a charged particle by the octupole is directed away from the optical axis. The force which is directed away from the optical axis changes the angle of the trajectory of the particles which enter the lens at the edge of the lens and which are excessively deflected towards the optical axis because of the spherical aberration, the excessive deflection thus being corrected for.

An octupole element is described in the publication by B. Bastian, K. Spengler and D. Typke: "Ein elektrisch-magnetisches Oktupolelement zur sphärischen un chromatischen Korrektur von Electronenlinsen", Optik 33, Heft 6, 1971, pp. 591–596. The octupole described in the cited publication comprises a ring on which eight radially extending poleshoes are mounted, each poleshoe being enclosed by a coil. Such an octupole is only suitable for the correction of third-order spherical aberration in two mutually perpendicular directions with a fixed orientation relative to the optical axis. Using such a construction, comprising, for example 16 poleshoes, a large number of octupole fields of different orientation can be obtained by selective energizing of the coils. To this end, for example each coil comprises its own controlled voltage source or current source. Two groups of eight coils are capable of generating two octupole fields whose orientation relative to the optical axis deviates 22.5° from one another. The two octupole fields can be combined so as to form one octupole field having any desired orientation by adjustment of the ratio of energizing of the two groups of coils.

A further embodiment of a charged particle beam device in accordance with the invention is characterized in that for the correction of spherical aberration the potential distribution furthermore comprises a quadrupole field distribution.

By application of a quadrupole field in addition to an octupole field, the defocusing of the objective lens is rendered dependent on the direction. The optimum defocus (Scherzer focus) is dependent on the spherical aberration. When the spherical aberration changes, the defocusing should also change in order to ensure that as many dispersed beams as possible undergo the same phase shift in the field of the objective lens and the multipole. The relationship between optimum defocus and spherical aberration leads to the use of a quadrupole.

A further embodiment of a charged particle beam device in accordance with the invention is characterized in that the multipole element comprises a combined magnetic and electrostatic multipole element for the correction of chromatic aberration.

The focal distance of a particle-optical lens is dependent on the energy of the charged particles. The trajectories of charged particles of different energy which are focused by a particle-optical lens exhibit an angular deviation relative to one another which is proportional to their difference in energy and which is proportional to their distance from the optical axis in the first-order. In the correction plane a quadrupole exerts a force on a charged particle which is also proportional to the distance from the optical axis. In one direction the force is oriented towards the optical axis and in the other direction it is oriented away from the optical axis. By combination of a magnetic and an electric quadrupole whose forces cancel one another for particles having a mean energy, a correction is obtained for chromatic aberrations in the direction in the correction plane in which the electrostatic force is directed away from the optical axis and the magnetic force is directed towards the optical axis. This is due to the fact that the magnetic force is greater for fast particles than for slow particles, so that the overall force on the fast particles is directed towards the optical axis and the overall force on the slow particles is directed away from the optical axis. An overall image corrected for chromatic aberrations in a number of directions is obtained by combination of the corrected images. Such a correction element for the correction of chromatic aberration is preferably used in combination with the correction element for correction of spherical aberration.

A further embodiment of a charged particle beam device in accordance with the invention is characterized in that between the at least one lens and the multipole element there is arranged at least one further lens for imaging an image plane of the at least one lens in the correction plane.

The further lens is capable of imaging the coma-free plane of the at least one lens in the correction plane of the correction element. In this respect it is advantageous to use a so-called 4-f system as described in H. Rose: "Outline of a spherically corrected semiaplanatic medium voltage transmission electron microscope", Optik 85, No. 1, 1990, pp. 19-24.

Another embodiment yet of a charged particle beam device in accordance with the invention is characterized in that the charged particle beam device comprises an electron-optical biprism for forming holograms.

A particle-optical biprism, for example a Möllenstedt biprism, splits a charged particle beam into an image-carrying beam and a reference beam. In the image plane the two beams interfere, thus forming a hologram which consists of a number of parallel, straight, alternately light and dark lines. These lines contain gradients which are a measure of thickness variations in the specimen irradiated by the charged particle beam. By selecting the correction direction to extend transversely of the line direction in the hologram, the resolution can be enhanced in the direction of the gradients in the lines and a quantitative measure of thickness variations can be derived which is more accurate than in the absence of correction.

BRIEF DESCRIPTION OF THE DRAWING

Some embodiments of a charged particle beam device in accordance with the invention will be described in detail hereinafter with reference to the accompanying drawing. Therein.

DESCRIPTION OF THE PREFERRED EMBODIMENT

Figure 1:
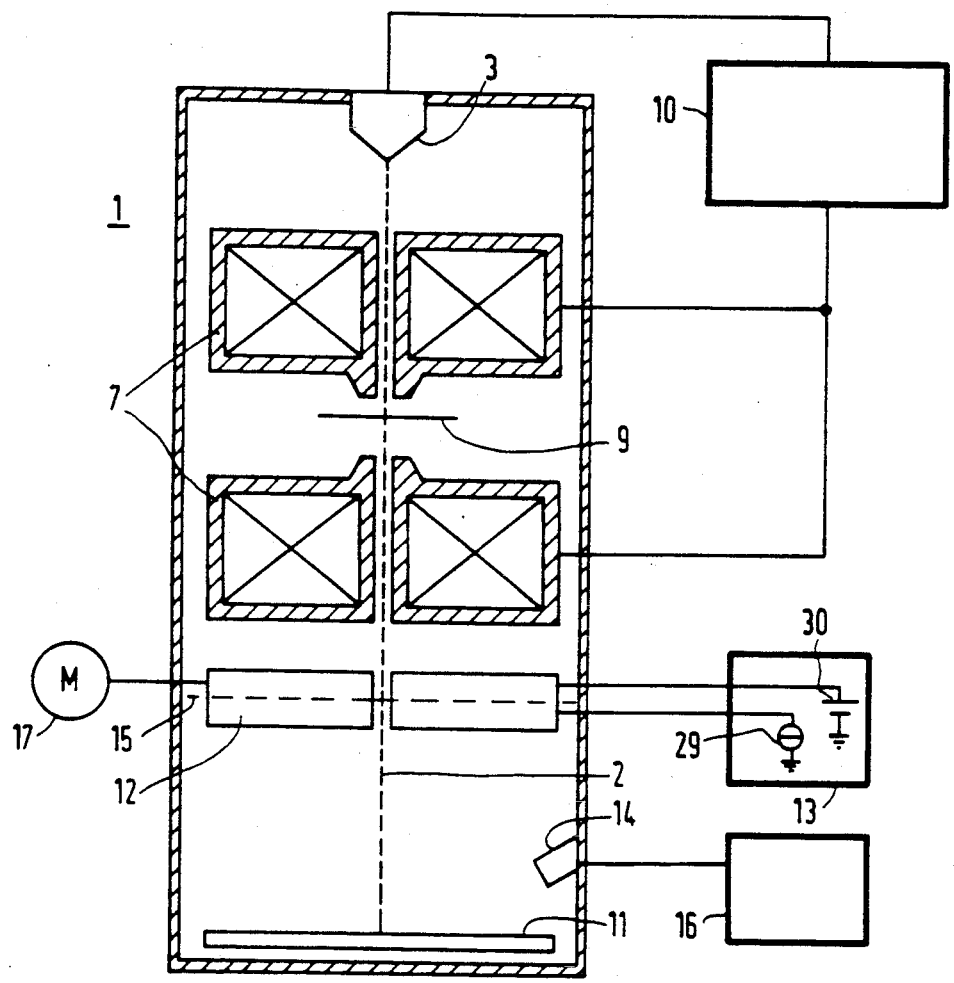
FIG. 1 shows diagrammatically a charged particle beam device in accordance with the invention.

FIG. 1 shows a charged particle beam device 1, notably a transmission electron microscope, in which an electron source 3 emits electrons which are accelerated along an optical axis 2 and which are directed onto a specimen 9 via a condensor system (not shown in the Figure) and an objective lens 7. After irradiation of the specimen 9, the electrons are imaged on an image plane 11 by means of the objective lens 7 and a lens system which is not shown in the Figure and which may comprise a diffraction lens, an intermediate lens and a projector system. Using a video camera 14, an image of the target is formed and stored in digitized form in a computer 16. A power supply unit 10 applies a high voltage to the source 3 which may amount to a few hundreds of kV and also energizes the lens 7.

The smallest observable dimension of a detail of the specimen 9 is approximately proportional to the wavelength of the electrons and inversely proportional to the angle of aperture $\alpha$ at which the electrons from the specimen 9 enter the objective lens 7. In order to achieve observability of as small as possible details, for example smaller than 0.5 Å, the angle of aperture $\alpha$ should be comparatively large, for example 20 mrad. The wavelength, being inversely proportional to the root of the acceleration voltage, can be reduced to, for example $2.10^{-2}$ Å at 300 kV by increasing the electron acceleration voltage applied to the source 3 by the power supply unit 10. The resolution, however, is limited by spherical and chromatic aberration of the objective lens 7. Due to spherical aberration, a point situated on the optical axis 2 in the object plane of the objective lens 7 is imaged in the image plane as a spot having a radius proportional to the third power of the angle of aperture $\alpha$. As the energy of the electrons increases, the relative energy spread decreases and a point situated on the optical axis in the object plane of the objective lens 7 is imaged as a spot whose radius is proportional to the relative electron energy spread. In order to achieve a resolution of less than 1 Å, correction for spherical and chromatic aberration in an electron-optical image is necessary. To this end, the electron microscope comprises a correction element in the form of a single multipole 12. By adjustment of the energizing of the poles of the multipole 12 by a power supply source 13, such a magnetic and/or electric potential distribution can be generated in a correction plane 15 that spherical and/or chromatic aberrations are corrected in a correction direction extending in the correction plane 15. The images, being corrected each time in one direction for chromatic aberration or each time in two directions for spherical aberration, are converted, via the video camera 14, into an electric signal which is digitized so as to be stored in an image memory of the computer 16. Via combination in the computer 16 of the images corrected each time in one direction, an overall image can be obtained which is substantially free from chromatic and spherical aberrations in a large number of directions. Instead of using the video camera 14 and the computer 16, photographic plates can be used for recording the images in the image plane 11. A corrected overall image can be formed by superposition of a number of photographic plates, each of which has been corrected in different directions, for example by simultaneous projection of a number of slides of the photographic plates.

One way of realising the selection of the desired correction direction is by way of image processing in the Fourier space. To this end, the electron microscope should comprise an image processing system incorporating a suitable image processing procedure. In the Fourier space, where the electron wave function is represented in the form of a diffraction pattern, the desired correction direction can be selected by means of a Fourier filter on the basis of intensity.

If the charged particle beam device is a transmission electron microscope, instead of selection of the desired correction direction by means of image processing, use can be made of a diaphragm which is arranged in the back focal plane or diffraction plane of the objective lens. In that plane each direction in the original image is represented by a line through the origin. A set of selected corrected direction is, therefore, a set of lines extending at different angles through one point in a plane perpendicular to the optical axis. To enable selection of a desired correction direction, the diaphragm and the electron beam should be movable relative to one another, which movement must be coupled to the rotation of the potential distribution of the energized multipole.

Figure 3A:
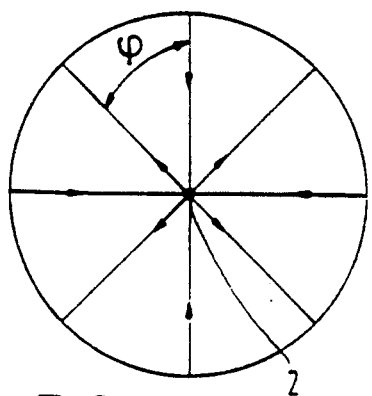
FIG. 3a shows the forces exerted on a charged particle in the correction plane by an octupole.
Figure 3B:
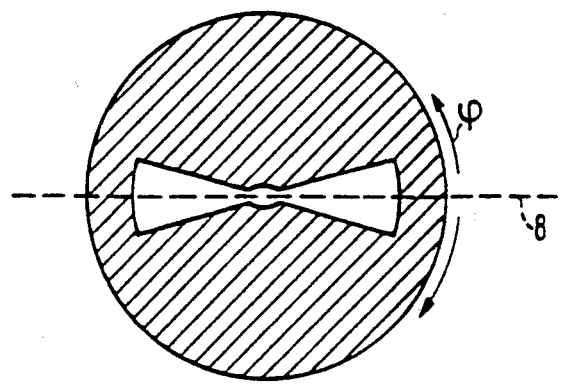
FIG. 3b shows diagrammatically the filter diaphragm upon combination of a quadrupole field distribution and an octupole field distribution.

A first possibility in this respect is the use of a rotatable diaphragm as shown in FIG. 3b.

A second possibility is to arrange a stationary diaphragm in the back focal plane of the objective lens to tilt the electron beam incident on the speciment and to rotate the tilting direction. The electron wave function will rotate relative to the diaphragm. Tilted illumination is known per se. The advantage of such illumination consists in that in the tilting direction the spherical aberration is less, so that the resolution is higher.

In the transmission electron microscope shown in FIG. 1, the correction element 12 is arranged underneath the specimen 9 (TEM mode). In the case of a scanning electron microscope (SEM/STEM mode), the correction element should be arranged above the specimen or even above the objective lens.

The plane of the objective lens with which the correction plane of the correction element is conjugated is approximately the principal plane of the objective lens in the case of TEM and also the principal plane of the objective lens in the case of SEM/STEM. The principal plane is to be understood to mean herein the plane of action of the objective lens.

When a drive of sufficient mechanical stability is used, the multipole 12 can also be rotated about the optical axis 2, for example by means of a piezoelectric motor 17.

Figure 2A:
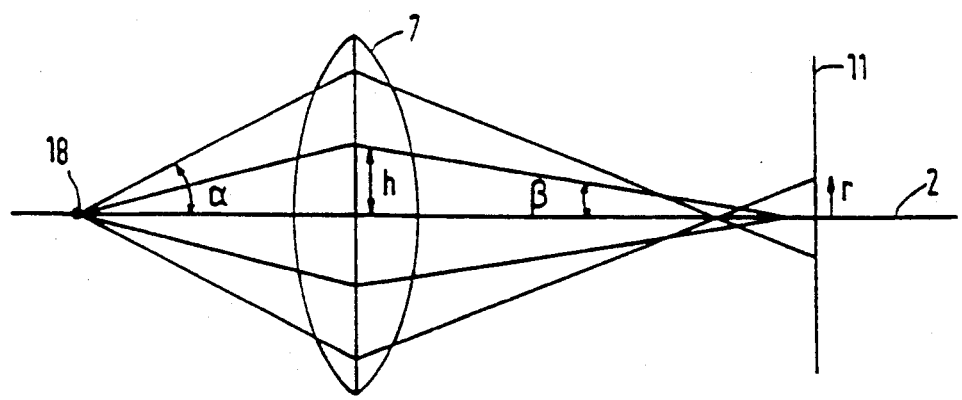
FIGS. 2a and 2b show the trajectory of charged particles for a particle-optical lens not corrected for spherical aberration and a particle-optical lens corrected for spherical aberration, respectively.
Figure 2B:
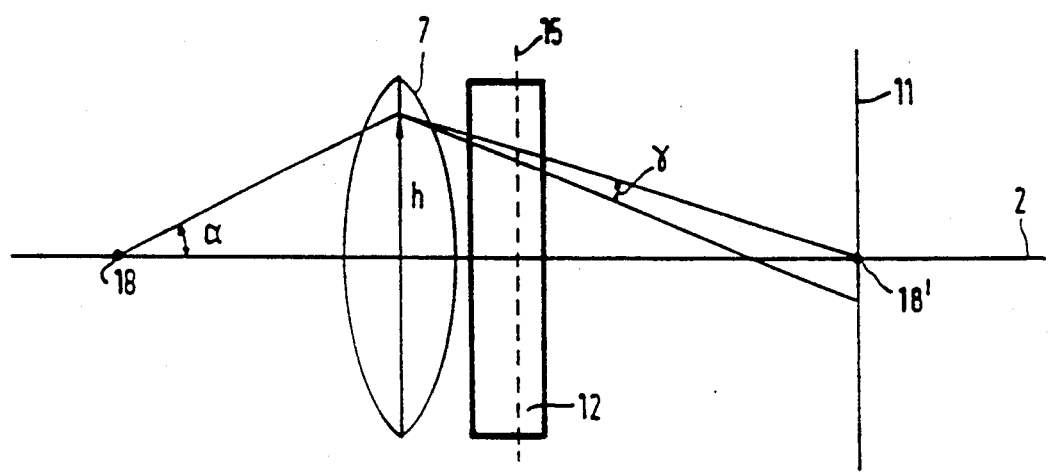

FIG. 2a shows the trajectories of charged particles which originate from a point 18 on the optical axis 2 and which are deflected by the lens 7. In rotationally symmetrical systems, the angle $\beta$ at which a trajectory situated at a distance h from the optical axis 2 enters the lens 19 is: $\beta = a1h + a3h^3 + a5h^5 + \ldots$. For a perfect lens, terms with powers greater than 1 are equal to zero. For trajectories originating from the point 18, the terms $a3h^3$ and $a5h^5$ are the third-order and the fifth-order spherical aberration, respectively. The third-order spherical aberration is usually dominant and causes the point 18 to be imaged as a spot in the image plane 11, which spot has a radius r given by: $r = Cs\alpha^3 M$. Therein, Cs is the spherical aberration constant and M is the transverse magnification. When a correction element 12 is arranged behind the lens 7 as shown in FIG. 2b the trajectories of the particles which enter the lens 7 at the level h are deflected away from the optical axis 2 at an angle $\gamma$ which is proportional to $h^3$. For a constant speed of the charged particles in the direction of the optical axis, the angular variation $\gamma$ is proportional to the force exerted on the particles by the correction element 12. Because a magnet octupole exerts a force on charged particles which is proportional to $h^3$, and hence also to $\alpha^3$, this multipole is suitable for correcting spherical aberration in two directions extending in the correction plane 15. In the case of SEM and STEM, the correction element 12 is situated in front of or in the objective lens 7 so that the beam path should be reversed.

FIG. 3a shows diagrammatically the direction of the forces exerted by the magnetic octupole 12 on the charged particles in the correction plane 15 which is coincident with the plane of drawing in this Figure. Around the optical axis 2 the magnetic potential $f_m = C_4 \cdot h^4 \cos 4\phi$, where $C_4$ is a constant term and $\phi$ is the angle of a point in the correction plane whose position is defined by the distance from the optical axis and this angle. In two mutually perpendicular directions in the correction plane 15 the force is directed away from the optical axis 2 and in two other, also mutually perpendicular directions the force is directed towards the optical axis, so that the spherical aberration increases in the latter directions.

Figure 4:
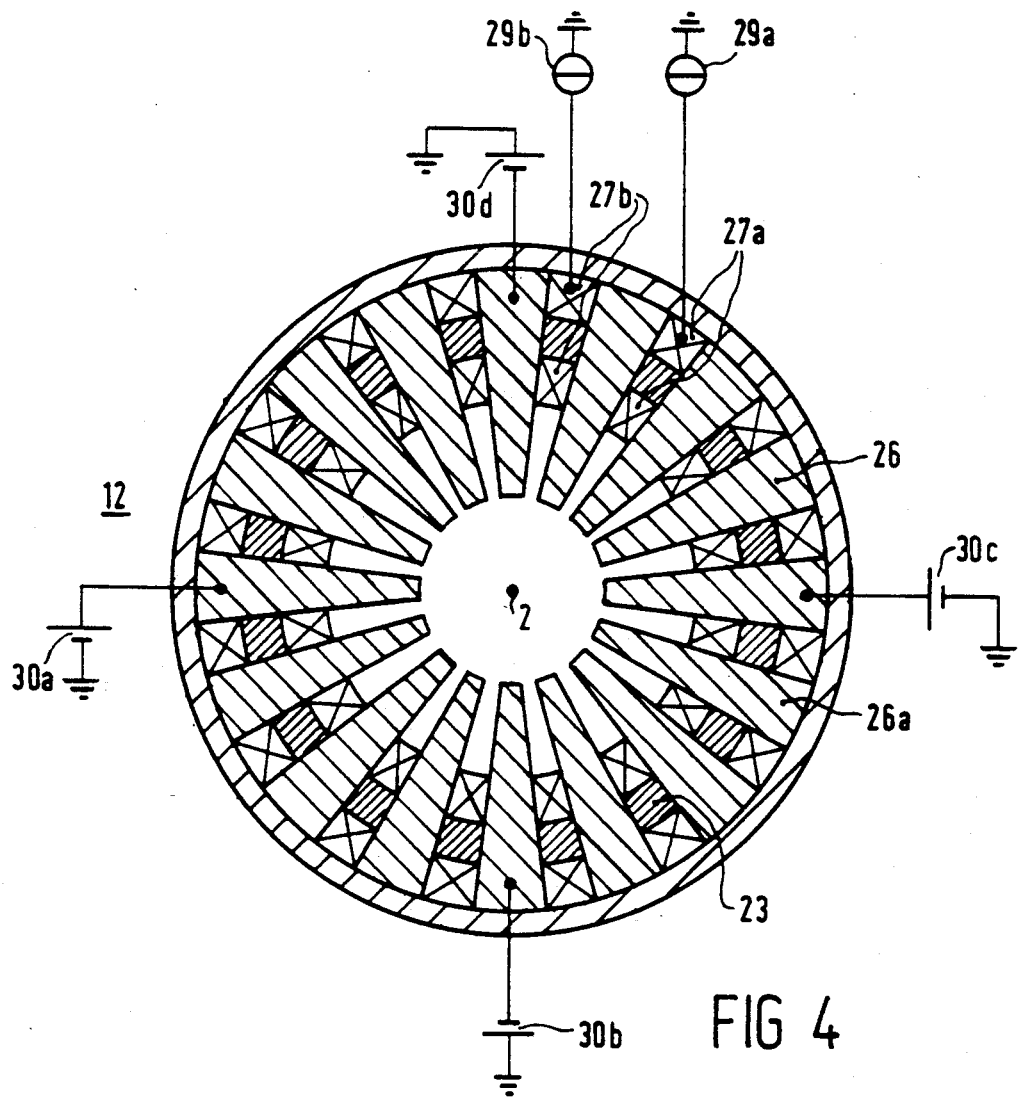
FIG. 4 shows a multipole element.

FIG. 4 shows a multipole element 12 comprising sixteen poleshoes 26 of a magnetic material which are mounted on a ring 23. Between two neighbouring poleshoes the ring 23 is enclosed by a coil, for example a coil 27a or 27b, each of which is energized by its own current source, only the current sources 29a and 29b being shown in the Figure. Via selective energizing of the current sources 29, each time an octupole field having a desired orientation can be obtained, said field being formed by combination of two octupole fields enclosing an angle of 22.5° relative to one another. As a result, spherical aberration can be corrected in two directions which are rotatable about the optical axis 2. It is also possible to connect a number of coils 27 in series for connection to a single current source 29, the number of turns of the series-connected coils being different so that a correct magnetic potential distribution is obtained.

By application of a quadrupole field in addition to the octupole field, the defocus or the lens strength of the objective lens is rendered dependent on the direction. The optimum defocus (Scherzer focus) is dependent on the spherical aberration. When the spherical aberration changes, the defocus should also change in order to ensure that as many dispersed beams as possible undergo the same phase shift in the field of the objective lens and the multipole. The relationship between the optimum defocus and the spherical aberration is such that a quadrupole field distribution is most suitable.

Due to the combination of an octupole field and a quadrupole field for correction of the spherical aberration, the correction element is no longer four-fold symmetrical as shown in FIG. 3a, but only two-fold symmetrical. For selection of the desired correction direction, therefore, the shape of the diaphragm should be adapted. FIG. 3b shows a relevant embodiment. The direction of maximum correction is denoted by the reference numeral 8.

Figure 5:
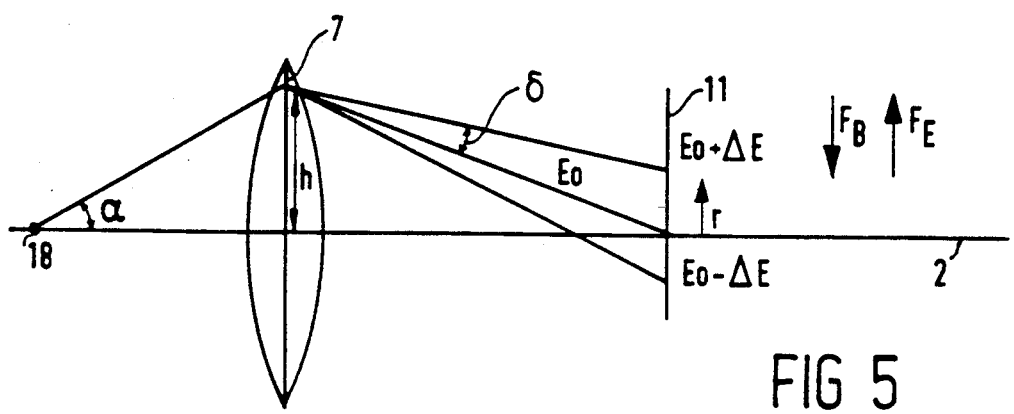
FIG. 5 shows the trajectory of charged particles of different energy for a particle-optical lens not corrected for chromatic aberration.
Figure 6:
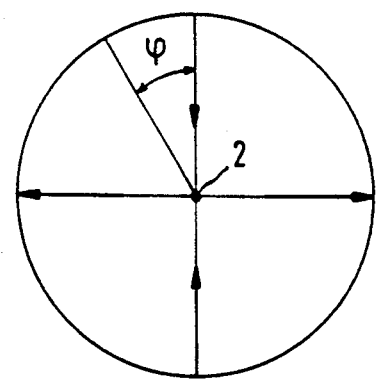
FIG. 6 shows the forces exerted on a charged particle in the correction plane by a quadrupole.

FIG. 5 shows the trajectories of charged particles of different energies which are deflected by the particle-optical lens 7 in a transmission electron microscope. In the case of a scanning electron microscope, the correction element is arranged in or above the objective lens, so that the beam path should be reversed. Particles having an energy which is higher than the mean energy $E_o$ are insufficiently deflected, whilst particles having an energy which is lower than the mean energy are excessively deflected. A point 18 on the optical axis 2 is imaged in the image plane 11 as a spot having a radius r which is given by: $r = \frac{1}{2} mCc\alpha\Delta E/E_o$. Therein, $\Delta E$ is the energy spread of the particles around the mean energy. The angular deviation $\delta$ between the trajectories of particles having a mean energy $E_o$ and an energy which deviates therefrom by an amount $\Delta E$ is proportional to $\alpha$, and hence to the distance h from the optical axis. A correction element for correcting chromatic aberrations does not exert a force on particles having the mean energy $E_o$ and deflects particles having energies higher or lower than the mean energy towards the optical axis 2 and away from the optical axis 2, respectively, the degree of deflection being proportional to the distance h from the optical axis. In the correction plane 15 a quadrupole element has a potential distribution f which is given by: $f = C_2 h^2 \cos 2\phi$. The direction of the forces exerted by the quadrupole is diagrammatically shown in FIG. 6. The force exerted on the charged particles by the quadrupole is proportional to the distance h from the optical axis and is directed towards the optical axis in one direction and away from the optical axis in a second direction as denoted by arrows in FIG. 6. By combination of a magnetic and an electric quadrupole whose forces oppose one another and cancel one another for a particle having the mean energy $E_o$, a correction element is obtained whereby chromatic aberration can be corrected in one direction, the chromatic aberration being doubled in the other direction. The force acting on a charged particle in a magnetic field is proportional to the speed of the particle. When the force FE exerted by the electrostatic quadrupole is directed away from the optical axis 2, and the force FB exerted by the magnetic quadrupole is directed towards the optical axis, as shown in FIG. 5, the sum of the electrostatic and the magnetic force on fast particles is directed towards the optical axis and the sum of the forces on slow particles is directed away from the optical axis 2. The sum of the forces is proportional to h. Voltage sources 30a-30d as shown in FIG. 4 supply four poles of the multipole element with a respective voltage. Each pole of the multipole element is connected to a voltage source, not all sources being shown in the Figure. The coils of these four poles are simultaneously energized, so that a combined electric and magnetic multipole is obtained which corrects the chromatic aberration in one direction in the correction plane and which also increases the chromatic aberration in one direction. The chromatic aberration can be successively corrected in any desired direction by selective activation of the current sources 29 and the voltage sources 30 of a multipole element as shown in FIG. 4.

Figure 7:
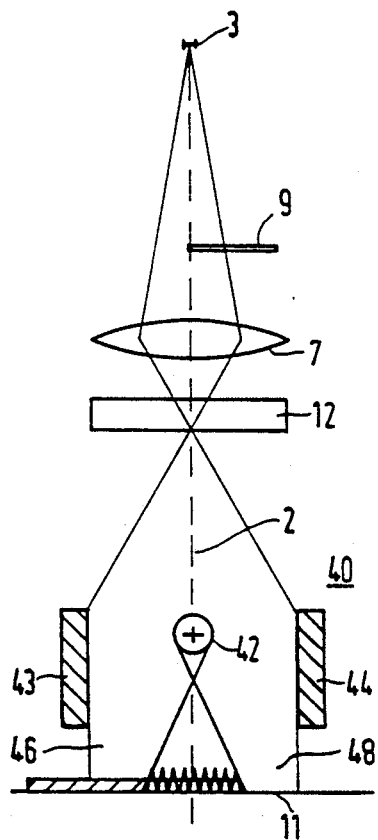
FIG. 7 shows a charged particle beam device comprising a particle-optical biprism.
Figure 8:
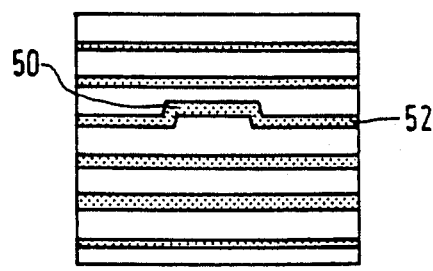
FIG. 8 shows a hologram formed by means of the biprism.

FIG. 7 shows an electron microscope comprising a Möllenstedt biprism 40 which comprises an electrically charged wire 42 which is flanked by two electrodes 43 and 44 at ground potential. In the biprism the electron beam is split into an image-carrying part 46 and a reference part 48 which parts interfere in the image plane 11. FIG. 8 shows a hologram thus formed. For completely flat specimens 9 the hologram consists of a number of parallel light and dark lines. Wherever a thickness difference occurs in the specimen, the phase of the image-carrying beam is shifted, resulting in a gradient 50 in a line 52. The size of the gradient amounts to a fraction of the line width. By rotation of the potential distribution of the multipole element 12 around the optical axis 2, cancelling correction of chromatic and/or spherical aberration in the direction perpendicular to the line direction in the hologram, the height of the gradient 50 can be more accurately measured, thus enabling accurate determination of the phase shifts due to the specimen.

For holography the selection of a desired correction direction can be realised by positioning the diaphragm at the area of the side bands of the hologram in which the linear image information is present. This means that filtering takes place on the basis of the wave function itself and not on the basis of intensity.

Correction of the spherical aberration in electron holography considerably reduces the delocalization of the image and makes the accuracy requirements for the transfer function of the electron microscope considerably less severe.

We claim:

1. A charged particle beam device, comprising a source for emitting a charged particle beam to an object plane, particle-optical elements which are arranged along an optical axis and which comprise at least one lens for forming an image of the object plane, and a correction element for correction of spherical and/or chromatic aberration in the image of the at least one lens, said correction element comprising a multipole element for generating a magnetic and/or electric potential distribution in a correction plane extending perpendicularly to the optical axis, characterized in that the charged particle beam device comprises means for rotating the potential distribution in the correction plane in order to adjust a correction direction during exposure.

2. A charged particle beam device as claimed in claim 1, characterized in that the charged particle beam device comprises means for combining a number of images which have been successively corrected in different correction directions.

3. A charged particle beam device as claimed in claim 2, characterized in that the correction plane is coincident with a plane conjugated with a principal plane of the lens.

4. A charged particle beam device as claimed in claim 1, characterized in that the lens is an objective lens.

5. A charged particle beam device as claimed in claim 1, characterized in that the charged particle beam device comprises an image processing system incorporating an image processing procedure for the selection of the corrected direction in an image.

6. A charged particle beam device as claimed in claim 1, which is constructed as a transmission electron microscope, characterized in that the charged particle beam device comprises a diaphragm for selecting the corrected direction in the back focal plane of the lens, the diaphragm and the charged particle beam being movable with respect to one another, which movement is coupled to the rotation of the potential distribution of the correction element.

7. A charged particle beam device as claimed in claim 1, characterized in that for correction of spherical aberration the potential distribution comprises an octupole distribution.

8. A charged particle beam device as claimed in claim 7, characterized in that the means for rotating the potential distribution comprise an electric power supply source for the selective energizing of an octupole field and/or a quadrupole field by means of the multipole element.

9. A charged particle beam device as claimed in claim 1, characterized in that for the correction of spherical aberration the potential distribution furthermore comprises a quadrupole field distribution.

10. A charged particle beam device as claimed in claim 1, characterized in that the multipole element comprises a combined magnetic and electrostatic multipole element for the correction of chromatic aberration.

11. A charged particle beam device as claimed in claim 10, characterized in that the means for rotating the potential distribution comprise an electric power supply source for the selective energizing of a quadrupole field by means of the magnetic multipole element and a quadrupole field by means of the electrostatic multipole element.

12. A charged particle beam device as claimed in claim 11, characterized in that the power supply source energizes the multipole elements in such a manner that in the correction plane the force exerted by the magnetic quadrupole field on charged particles having a predetermined energy substantially cancels the force exerted on the charged particles by the electric quadrupole field.

13. A charged particle beam device as claimed in claim 1, characterized in that between the at least one lens and the multipole element there is arranged at least one further lens for imaging a plane of the at least one lens in the plane of the correction element.

14. A charged particle beam device as claimed in claim 1, characterized in that between the at least one lens and the multipole element there are arranged two further lenses having a focal distance f, a distance between the principal plane of the at least one lens and the plane of the correction element amounting to substantially 4 f, the distance between the two further lenses amounting to 2 f and the distance between the plane of the at least one lens and the correction plane, respectively, and the nearest further lens amounting to f.

15. A charged particle beam device as claimed in claim 1, characterized in that the charged particle beam device comprises an electron-optical biprism for forming holograms.

* * * * *